(12) United States Patent
Lee

(10) Patent No.: US 6,890,780 B2
(45) Date of Patent: May 10, 2005

(54) METHOD FOR FORMING AN ELECTROSTATICALLY-DOPED CARBON NANOTUBE DEVICE

(75) Inventor: Ji Ung Lee, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 19 days.

(21) Appl. No.: 10/683,895

(22) Filed: Oct. 10, 2003

(65) Prior Publication Data
US 2005/0077527 A1 Apr. 14, 2005

(51) Int. Cl.[7] .......................... H01L 21/00; H01L 29/12
(52) U.S. Cl. ..................... 438/23; 257/79; 257/E33.01; 977/DIG. 1
(58) Field of Search .............................. 438/23, 22, 28, 438/34, 800; 257/79, 13, E33.01, E51.018, E51.022; 977/DIG. 1

(56) References Cited

U.S. PATENT DOCUMENTS 6,423,583 B1 7/2002 Avouris et al.
2002/0172639 A1 * 11/2002 Horiuchi et al. .......... 423/447.2

OTHER PUBLICATIONS

Ali Javey et al., High–K Dielectrics for Advanced Carbon–Nanotube Transistors and Logic Gates, Nature Materials, Nov. 17, 2002.

* cited by examiner

Primary Examiner—Craig A. Thompson
(74) Attorney, Agent, or Firm—Fletcher Yoder

(57) ABSTRACT

The present invention provides a method and associated structure for forming an electrostatically-doped carbon nanotube device. The method includes providing a carbon nanotube having a first end and a second end. The method also includes disposing a first metal contact directly adjacent to the first end of the carbon nanotube, wherein the first metal contact is electrically coupled to the first end of the carbon nanotube, and disposing a second metal contact directly adjacent to the second end of the carbon nanotube, wherein the second metal contact is electrically coupled to the second end of the carbon nanotube. The method further includes disposing a first metal electrode adjacent to and at a distance from the first end of the carbon nanotube, wherein the first metal electrode is capacitively coupled to the first end of the carbon nanotube, and disposing a second metal electrode adjacent to and at a distance from the second end of the carbon nanotube, wherein the second metal electrode is capacitively coupled to the second end of the carbon nanotube. The method still further includes selectively applying a first bias to the first metal electrode to electrostatically dope the first end of the carbon nanotube and selectively applying a second bias to the second metal electrode to electrostatically dope the second end of the carbon nanotube.

52 Claims, 7 Drawing Sheets

METHOD FOR FORMING AN ELECTROSTATICALLY-DOPED CARBON NANOTUBE DEVICE

FIELD OF THE INVENTION

The present invention relates generally to the field of nanotechnology. More specifically, the present invention relates to a method and associated structure for forming an electrostatically-doped carbon nanotube device. The electrostatically-doped carbon nanotube device of the present invention is suitable for use as a light-emitting diode ("LED"), as well as in other applications.

BACKGROUND OF THE INVENTION

Carbon nanotubes have attracted a great deal of attention in recent years due to their possibilities for use as nanoscale electronic devices, such as diodes, transistors and semiconductor circuits. Structurally, a carbon nanotube resembles a hexagonal lattice of carbon rolled into a cylinder and may belong to one of two varieties, a single-walled variety and a multi-walled variety. Either of these varieties may, in whole or in part, exhibit the behavior of a metal or a semiconductor material, depending upon their chirality (i.e., conformational geometry).

Carbon nanotubes that exhibit the behavior of a semiconductor material are typically doped using various chemical methods. In other words, different chemicals are used to create p-type (hole majority carrier) regions and n-type (electron majority carrier) regions in the carbon nanotube. This results in a P-N junction that, when an appropriate voltage is applied, emits light (in the case of a light-emitting diode ("LED")). The chemical methods for doping a carbon nanotube, however, suffer from the problem that the p-type regions and the n-type regions are typically not well characterized, resulting in nanoscale electronic devices with reduced performance characteristics.

Thus, what is needed are a method and associated structure for forming an electrostatically-doped carbon nanotube device having well characterized p-type regions and n-type regions, allowing for the creation of nanoscale electronic devices, such as LEDs and the like, with enhanced performance characteristics.

BRIEF SUMMARY OF THE INVENTION

The present invention provides a method and associated structure for forming an electrostatically-doped carbon nanotube device having well characterized p-type regions and n-type regions, allowing for the creation of nanoscale electronic devices, such as light-emitting diodes ("LEDs") and the like, with enhanced performance characteristics. More specifically, the present invention provides for the use of a plurality of doping electrodes that are decoupled from a plurality of bias electrodes. Thus, the doping of a carbon nanotube may be finely tuned by varying the bias of each of the plurality of bias electrodes. Advantageously, the method and associated structure of the present invention are capable of providing a carbon nanotube having a P-N junction, a P-I-P junction, a P-I-N junction, an N-I-P junction, an N-I-N junction, a P-N-P junction or an N-P-N junction.

In one embodiment of the present invention, a method for forming an electrostatically-doped carbon nanotube device includes providing a carbon nanotube having a first end and a second end. The method also includes disposing a first metal contact directly adjacent to the first end of the carbon nanotube, wherein the first metal contact is electrically coupled to the first end of the carbon nanotube, and disposing a second metal contact directly adjacent to the second end of the carbon nanotube, wherein the second metal contact is electrically coupled to the second end of the carbon nanotube. The method further includes disposing a first metal electrode adjacent to and at a distance from the first end of the carbon nanotube, wherein the first metal electrode is capacitively coupled to the first end of the carbon nanotube, and disposing a second metal electrode adjacent to and at a distance from the second end of the carbon nanotube, wherein the second metal electrode is capacitively coupled to the second end of the carbon nanotube. The method still further includes selectively applying a first bias to the first metal electrode to electrostatically dope the first end of the carbon nanotube and selectively applying a second bias to the second metal electrode to electrostatically dope the second end of the carbon nanotube.

In another embodiment of the present invention, a structure for forming an electrostatically-doped carbon nanotube device includes a carbon nanotube having a first end and a second end. The structure also includes a first metal contact disposed directly adjacent to the first end of the carbon nanotube, wherein the first metal contact is electrically coupled to the first end of the carbon nanotube, and a second metal contact disposed directly adjacent to the second end of the carbon nanotube, wherein the second metal contact is electrically coupled to the second end of the carbon nanotube. The structure further includes a first metal electrode disposed adjacent to and at a distance from the first end of the carbon nanotube, wherein the first metal electrode is capacitively coupled to the first end of the carbon nanotube, and a second metal electrode disposed adjacent to and at a distance from the second end of the carbon nanotube, wherein the second metal electrode is capacitively coupled to the second end of the carbon nanotube. The first metal electrode is operable for receiving a first bias to electrostatically dope the first end of the carbon nanotube and the second metal electrode is operable for receiving a second bias to electrostatically dope the second end of the carbon nanotube.

In a further embodiment of the present invention, a method for forming an electrostatically-doped carbon nanotube device includes providing a semiconductor layer having a surface and disposing a first insulating layer having a surface on the surface of the semiconductor layer. The method also includes patterning and selectively disposing a metal electrode material having a surface on the surface of the first insulating layer and disposing a second insulating layer having a surface on the surface of the first insulating layer and the surface of the metal electrode material. The method further includes patterning and selectively disposing a metal contact material having a surface on the surface of the second insulating layer and patterning and selectively disposing a catalyst material on the surface of the metal contact material. The method still further includes growing a carbon nanotube from the catalyst material, wherein the carbon nanotube is aligned substantially parallel to the surface of the second insulating layer, and wherein a portion of the carbon nanotube is in contact with a portion of the metal contact material.

BRIEF DESCRIPTION OF THE DRAWINGS

Preferred embodiments of the present invention are described in detail below, with reference to the accompanying drawings, in which.

DETAILED DESCRIPTION OF THE INVENTION

The present invention provides a method and associated structure for forming an electrostatically-doped carbon nanotube device having well characterized p-type regions and n-type regions, allowing for the creation of nanoscale electronic devices, such as light-emitting diodes ("LEDs") and the like, with enhanced performance characteristics. More specifically, the present invention provides for the use of a plurality of doping electrodes that are decoupled from a plurality of bias electrodes. Thus, the doping of a carbon nanotube may be finely tuned by varying the bias of each of the plurality of bias electrodes. Advantageously, the method and associated structure of the present invention are capable of providing a carbon nanotube having a P-N junction, a P-I-P junction, a P-I-N junction, an N-I-P junction, an N-I-N junction, a P-N-P junction or an N-P-N junction.

Figure 1:
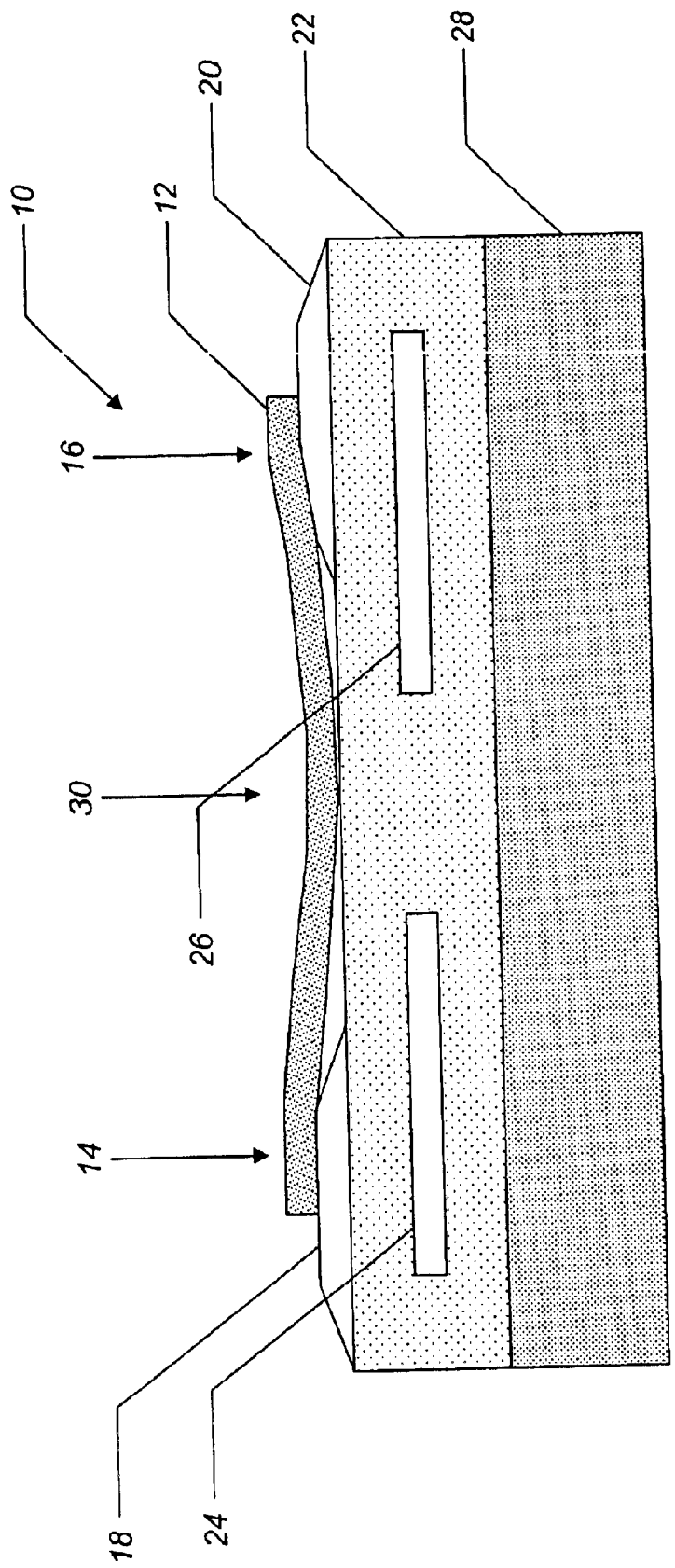
FIG. 1 is a cross-sectional view of one embodiment of the structure for forming an electrostatically-doped carbon nanotube device of the present invention.

Referring to FIG. 1, in one embodiment of the present invention, a structure for forming an electrostatically-doped carbon nanotube device 10 includes a carbon nanotube 12 having a first end 14 and a second end 16. The carbon nanotube 12 may be either a single-walled carbon nanotube ("SWCNT") or a multi-walled carbon nanotube ("MWCNT"). The carbon nanotube 12 has a length of between about 0.1 microns and about 10 microns and a diameter of between about 0.4 nm and about 20 nm, however other suitable dimensions may be used. In general, a carbon nanotube may act as a metal or a semiconductor material, depending upon its chirality (i.e., conformational geometry). Preferably, the carbon nanotube 12 of the present invention acts as a semiconductor material. The first end 14 of the carbon nanotube 12 is disposed adjacent to and in direct electrical contact with a first metal contact 18. Likewise, the second end 16 of the carbon nanotube 12 is disposed adjacent to and in direct electrical contact with a second metal contact 20. The first metal contact 18 and the second metal contact 20 are each made of Ti, Mo, Au, Cr or the like, and each has an area or size of between about 0.1 microns by about 10 microns and about 1 micron by about 10 microns. In general, any dimensions that provide adequate electrical contact with the first end 14 of the carbon nanotube 12 and the second end 16 of the carbon nanotube 12 may be used. The first metal contact 18 and the second metal contact 20 may be disposed either above or below the first end 14 of the carbon nanotube 12 and the second end 16 of the carbon nanotube 12, respectively.

The first metal contact 18 and the second metal contact 20 are disposed on the surface of a dielectric material 22. The dielectric material 22 includes $SiO_2$, $Si_3N_4$, $Al_2O_3$, $ZrO_2$ or the like. A first metal electrode 24 and a second metal electrode 26 are disposed within the dielectric material 22, adjacent to and at a distance from the first metal contact 18 and the second metal contact 20, respectively. Because of this separation, the first metal electrode 24 is capacitively coupled to the first end 14 of the carbon nanotube 12 and the second metal electrode 26 is capacitively coupled to the second end 16 of the carbon nanotube 12. Preferably, the distance between the first metal electrode 24 and the first end 14 of the carbon nanotube 12 and the second metal electrode 26 and the second end 16 of the carbon nanotube 12 is between about 2 nm and about 100 nm, respectively. The first metal electrode 24 and the second metal electrode 26 are each made of Mo, Ti, Pt, Au, Cr or the like, and each has an area or size of between about 0.1 microns by about 10 microns and about 1 micron by about 10 microns. Advantageously, the area or size of the first metal electrode 24 and the second metal electrode 26 may be selected to achieve a desired spacing between the first metal electrode 24 and the second metal electrode 26. The significance of this spacing is described in detail below. Preferably, the first metal electrode 24 is separated from the second metal electrode 26 by a distance of between about 100 nm and about 1 micron.

The dielectric material 22 is disposed on the surface of a semiconductor material 28, such as Si, SiC or the like. Alternatively, the dielectric material 22 is disposed on the surface of a metal layer 28, such as Al, Cr, Mo, Ti, Pt or the like. As described above, the carbon nanotube 12 has a first end 14 and a second end 16. Accordingly, a center section 30 is disposed between the first end 14 of the carbon nanotube 12 and the second end 16 of the carbon nanotube 12. In one embodiment of the present invention, a portion of the semiconductor material 28 is disposed adjacent to and at a distance from the center section 30 of the carbon nanotube 12, with the dielectric material 22, a portion of the first metal electrode 24 and a portion of the second metal electrode 26 disposed between the semiconductor material 28 and the center section 30 of the carbon nanotube 12. In an alternative embodiment of the present invention, a portion of the semiconductor material 28 is disposed adjacent to and at a distance from the center section 30 of the carbon nanotube 12, with only the dielectric material 22 disposed between the semiconductor material 28 and the center section 30 of the carbon nanotube 12. Again, this difference relates to the spacing between the first metal electrode 24 and the second metal electrode 26 and its significance is described in detail below.

Figure 2:
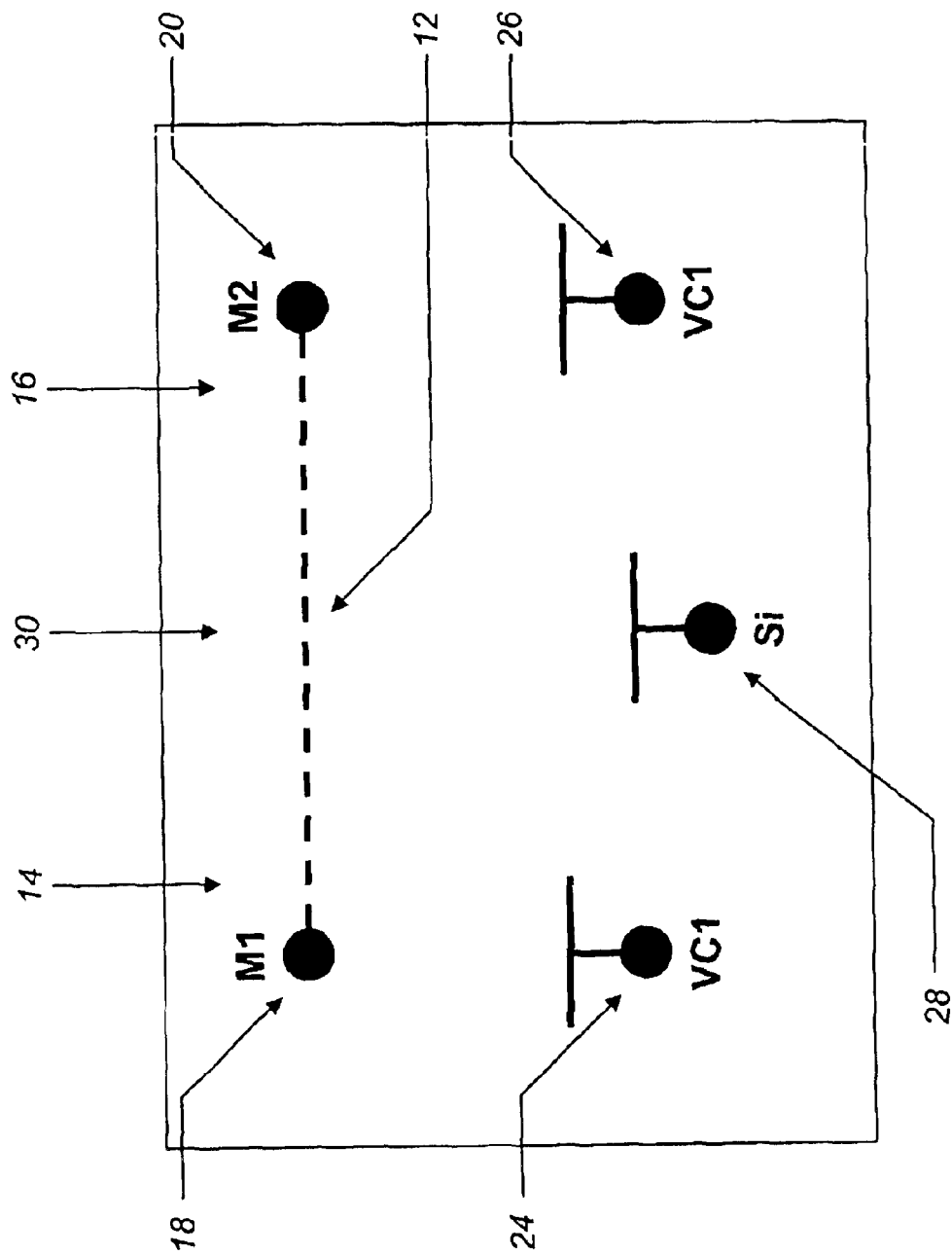
FIG. 2 is a circuit diagram representing one embodiment of the structure for forming an electrostatically-doped carbon nanotube device of the present invention.

Referring to FIG. 2, the structure for forming an electrostatically-doped carbon nanotube device 10 (FIG. 1) is represented by a circuit diagram. The first metal contact ("M1") 18 is electrically coupled to the first end 14 of the carbon nanotube 12 and the second metal contact ("M2") 20 is electrically coupled to the second end 16 of the carbon nanotube 12. Similarly, the first metal electrode ("VC1") 24 is capacitively coupled to the first end 14 of the carbon nanotube 12 and the second metal electrode ("VC2") 26 is capacitively coupled to the second end 16 of the carbon nanotube 12. In this respect, VC1 24 and VC2 26 form a first gate and a second gate, respectively. In the alternative embodiment of the present invention described above, with only the dielectric material 22 (FIG. 1) disposed between the semiconductor material 28 and the center section 30 of the carbon nanotube 12, the semiconductor material ("SI") 28 is capacitively coupled to the center section 30 of the carbon nanotube 12 and forms a third gate, which otherwise does not exist.

In operation, a first bias is applied to VC1 24, resulting in the electrostatic doping of the first end 14 of the carbon nanotube 12. Likewise, a second bias is applied to VC2 26, resulting in the electrostatic doping of the second end 16 of the carbon nanotube 12. Depending upon the bias applied, the first end 14 of the carbon nanotube 12 and the second end 16 of the carbon nanotube 12 may each be made a p-type semiconductor (hole majority carrier) or an n-type semiconductor (electron majority carrier). If the first end 14 of the carbon nanotube 12 is made a p-type semiconductor and the second end 16 of the carbon nanotube 12 is made an n-type semiconductor, or vice versa, the result is a P-N junction. A P-N junction may be used to form a light-emitting diode ("LED"), as is well known to those of ordinary skill in the art. The preferred voltage range of the structure for forming an electrostatically-doped carbon nanotube device 10 is between about 1 V and about 30 V.

In the alternative embodiment of the present invention described above, with only the dielectric material 22 disposed between SI 28 and the center section 30 of the carbon nanotube 12, SI 28 is used to modulate the doping of the center section 30 of the carbon nanotube 12. Thus, the center section 30 of the carbon nanotube 12 may be made a p-type semiconductor, an I-type (intrinsic) semiconductor or an n-type semiconductor. This results in a number of possible configurations, summarized in Table I below, and a number of possible devices, well known to those of ordinary skill in the art.

TABLE 1

Electrostatically-Doped Carbon Nanotube Junctions and Devices

| Bias Modes | | | | |
|---|---|---|---|---|
| VC1 | SI | VC2 | Junction | Device(s) |
| Low | — | Low | P-I-P | Back-to-Back Junctions |
| Low | — | High | P-I-N | Light-Emitting Diode ("LED") |
| High | — | Low | N-I-P | Light-Emitting Diode ("LED") |
| High | — | High | N-I-N | Back-to-Back Junctions |
| Low | High | Low | P-N-P | Bipolar Junctions |
| High | Low | High | N-P-N | Bipolar Junctions |

Figure 3:
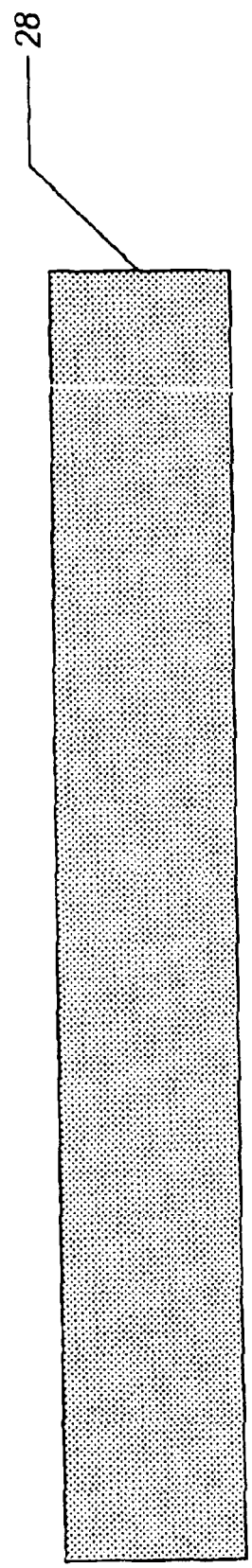
FIG. 3 is a cross-sectional view of a portion of one embodiment of the structure for forming an electrostatically-doped carbon nanotube device of the present invention, illustrating a first step in one embodiment of the method for forming an electrostatically-doped carbon nanotube device of the present invention.
Figure 4:
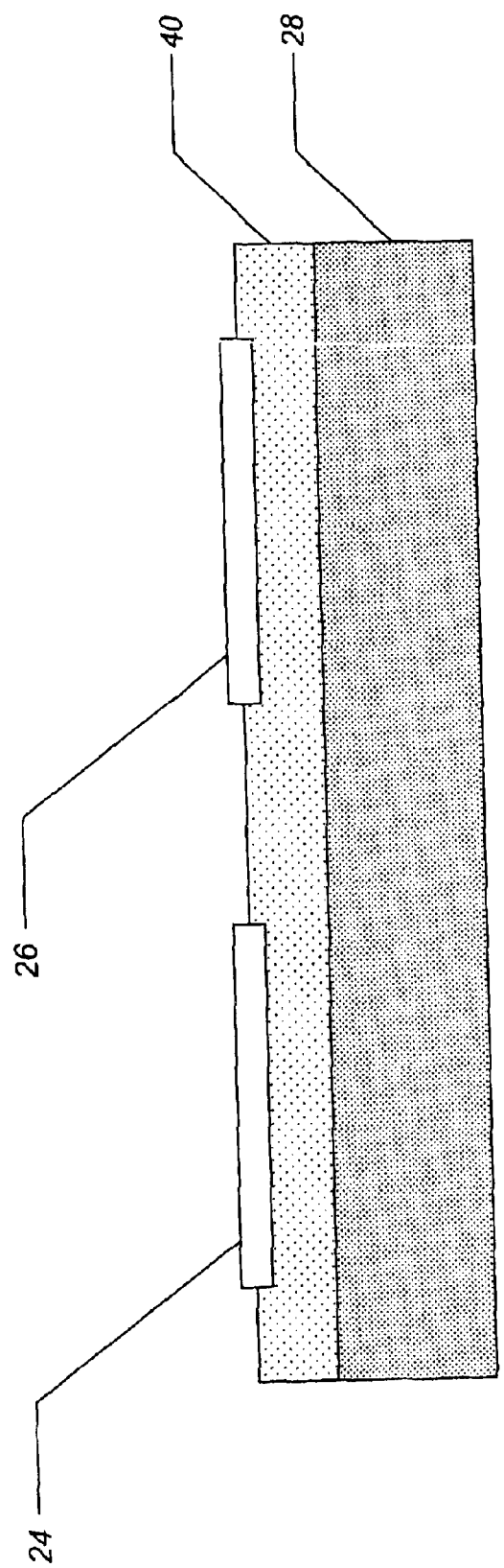
FIG. 4 is another cross-sectional view of a portion of one embodiment of the structure for forming an electrostatically-doped carbon nanotube device of the present invention, illustrating a second step in one embodiment of the method for forming an electrostatically-doped carbon nanotube device of the present invention.

Referring to FIGS. 3 and 4, in another embodiment of the present invention, a method for forming an electrostatically-doped carbon nanotube device includes first providing the semiconductor layer 28 described above. Again, the semiconductor layer 28 includes Si, SiC or the like. Alternatively, a metal layer 28 may be provided, such as Al, Cr, Mo, Ti, Pt or the like. Preferably, the semiconductor layer 28 has a thickness of between about 1 micron and about 550 microns. A first insulating layer 40 is deposited or grown on the surface of the semiconductor layer 28 using a thermal oxide, a chemical vapor deposition dielectric, a plasma-enhanced chemical vapor deposition dielectric, a low-pressure chemical vapor deposition dielectric or the like. The first insulating layer 40 includes $SiO_2$, $Si_3N_4$, $Al_2O_3$, $ZrO_2$ or the like. Preferably, the first insulating layer 40 has a thickness of between about 2 nm and about 100 mm. Following the deposition or growth of the first insulating layer 40, a metal electrode material is patterned and deposited on the surface of the first insulating layer 40 to form the first metal electrode 24 and the second metal electrode 26 described above. The metal electrode material includes Mo, Ti, Pt, Au, Cr or the like. Preferably, the first metal electrode 24 and the second metal electrode 26 each have a thickness of between about 10 nm and about 100 nm.

Figure 5:
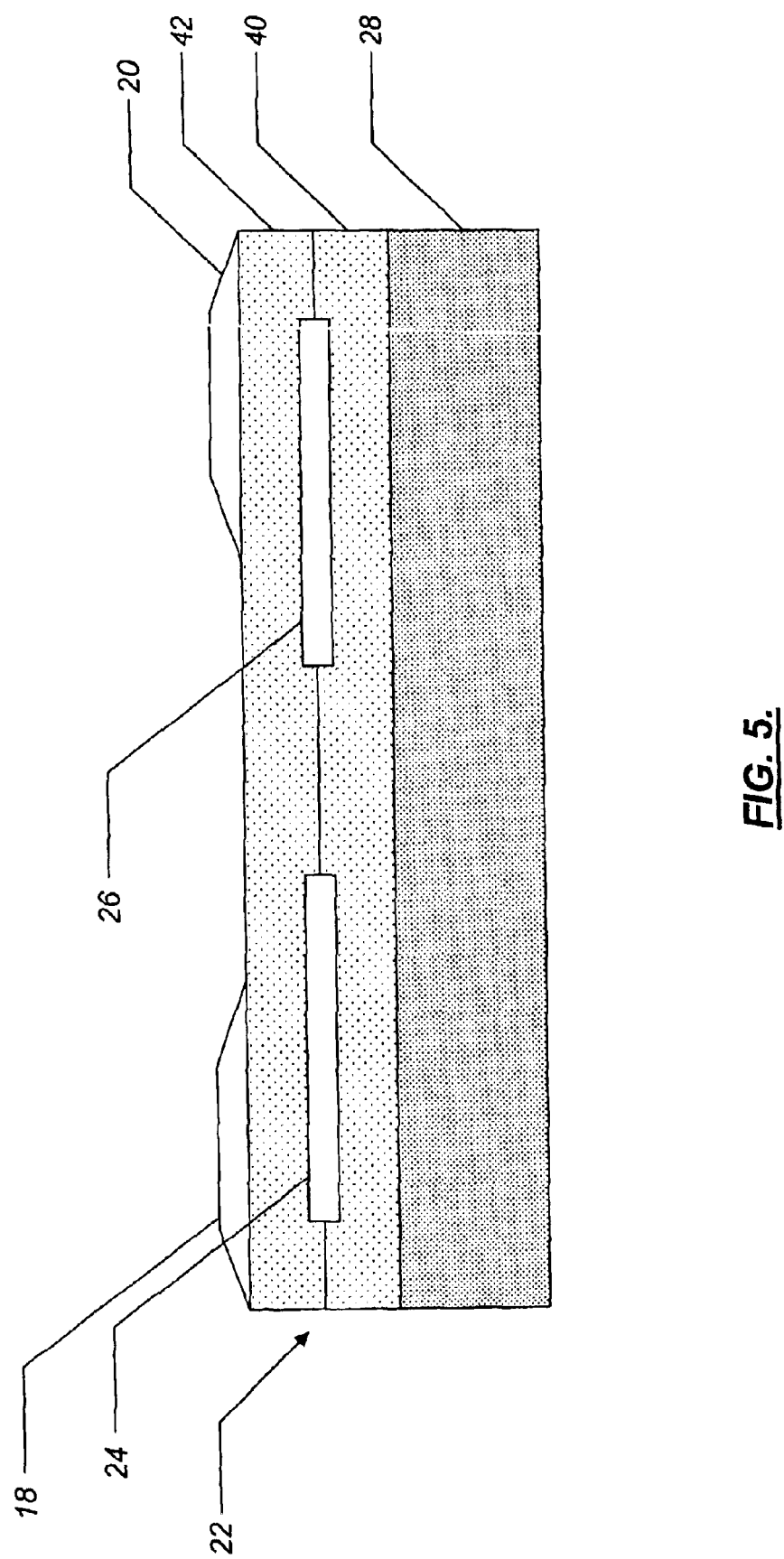
FIG. 5 is a further cross-sectional view of a portion of one embodiment of the structure for forming an electrostatically-doped carbon nanotube device of the present invention, illustrating a third step in one embodiment of the method for forming an electrostatically-doped carbon nanotube device of the present invention.

Referring to FIG. 5, a second insulating layer 42 is then deposited or grown on the surface of the first insulating layer 40, substantially surrounding the first metal electrode 24 and the second metal electrode 26, using a chemical vapor deposition dielectric, a plasma-enhanced chemical vapor deposition dielectric, a low-pressure chemical vapor deposition dielectric or the like. The second insulating layer 42 includes $SiO_2$, $Si_3N_4$, $Al_2O_3$, $ZrO_2$ or the like. Preferably, the second insulating layer 42 has a thickness of between about 2 nm and about 100 nm. Collectively, the first insulating layer 40 and the second insulating layer 42 form the dielectric layer 22 described above. Following the deposition or growth of the second insulating layer 42, a metal contact material is patterned and deposited on the surface of the second insulating layer 42 to form the first metal contact 18 and the second metal contact 20 described above. The metal contact material includes Ti, Mo, Au, Cr or the like. Preferably, the first metal contact 18 and the second metal contact 20 each have a thickness of between about 10 nm and about 100 nm.

Figure 6:
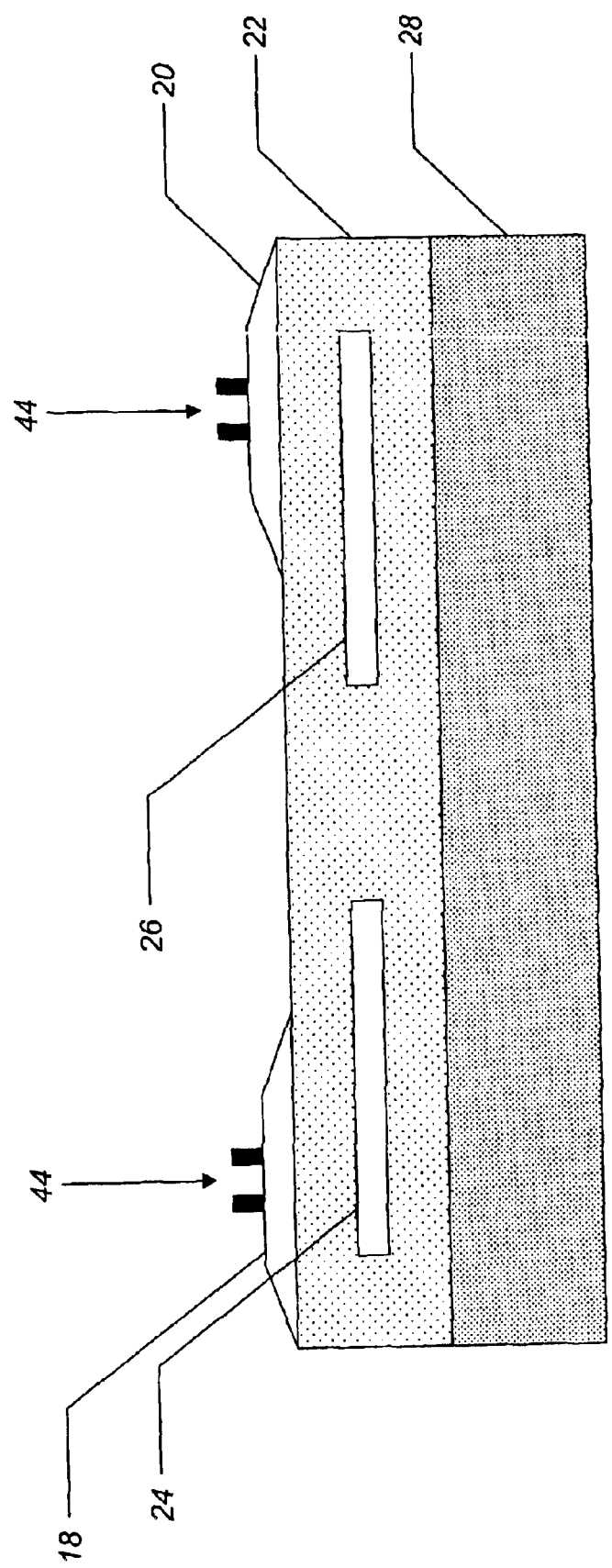
FIG. 6 is a still further cross-sectional view of a portion of one embodiment of the structure for forming an electrostatically-doped carbon nanotube device of the present invention, illustrating a fourth step in one embodiment of the method for forming an electrostatically-doped carbon nanotube device of the present invention.
Figure 7:
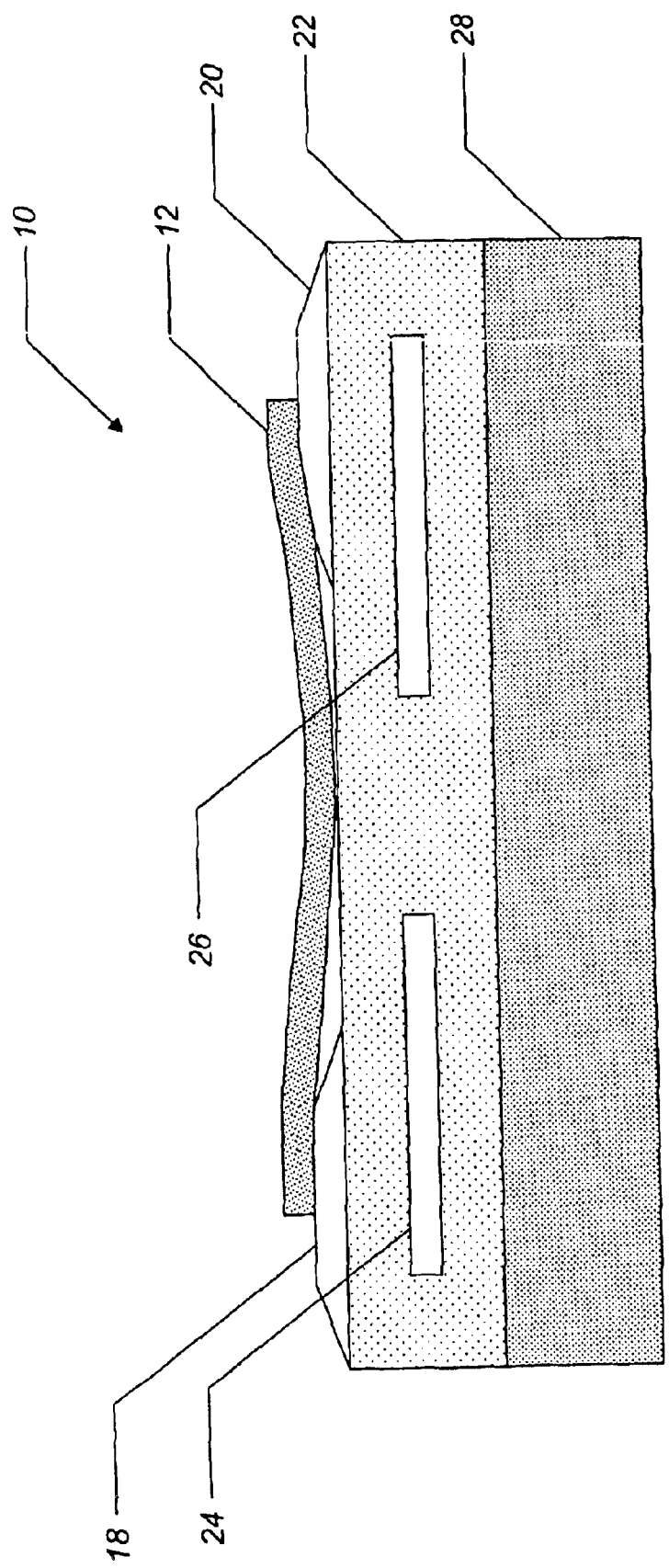
FIG. 7 is a still further cross-sectional view of a portion of one embodiment of the structure for forming an electrostatically-doped carbon nanotube device of the present invention, illustrating a fifth step in one embodiment of the method for forming an electrostatically-doped carbon nanotube device of the present invention.

Referring to FIG. 6, a catalyst material 44 suitable for growing a carbon nanotube is then patterned and deposited on the surfaces of the first metal contact 18 and the second metal contact 20 using, for example, a lift-off technique, well known to those of ordinary skill in the art. The catalyst material 44 may take the form of a thin film or a nanoparticle and includes Ni, Fe, Co, Mo, $Al_2O_3$ in Fe nitrate or the like. Preferably, the catalyst material 44 has a thickness of between about 0.1 nm and about 1 nm. Prior to depositing the catalyst material 44 on the surfaces of the first metal contact 18 and the second metal contact 20, the surfaces of the first metal contact 18 and the second metal contact 20, as well as the dielectric layer 22, may be selectively coated with photo-resist. This photo-resist forms the appropriate pattern for the deposition of the catalyst material 44 and is subsequently removed. It should be noted that the catalyst material may be selectively deposited on the surface of only one of the first metal contact 18 and the second metal contact 20. Following the deposition of the catalyst material 44, the carbon nanotube 12 described above is grown, as illustrated in FIG. 7. Preferably, the carbon nanotube 12 is aligned substantially parallel to the surface of the dielectric layer 22. In general, the carbon nanotube 12 is grown in a chemical vapor deposition (CVD) tube coupled to a flowing carbon (hydrocarbon) source, such as a methane source or an acetylene source, at between about 700 degrees C. and about 1000 degrees C. The catalyst material 44 forms a plurality of "islands" at these temperatures and becomes supersaturated with carbon. Eventually, the carbon nanotube 12 grows from these catalyst islands. This process is well known to those of ordinary skill in the art.

Although the present invention has been illustrated and described with reference to preferred embodiments and examples thereof, it will be readily apparent to those of ordinary skill in the art that other embodiments and examples may perform similar functions and/or achieve similar results. All such equivalent embodiments and examples are within the spirit and scope of the present invention and are intended to be covered by the following claims.

What is claimed is:

1. A method for forming an electrostatically-doped carbon nanotube device, comprising:
   providing a carbon nanotube having a first end and a second end;
   disposing a first metal contact directly adjacent to the first end of the carbon nanotube, wherein the first metal contact is electrically coupled to the first end of the carbon nanotube;
   disposing a second metal contact directly adjacent to the second end of the carbon nanotube, wherein the second metal contact is electrically coupled to the second end of the carbon nanotube;
   disposing a first metal electrode adjacent to and at a distance from the first end of the carbon nanotube, wherein the first metal electrode is capacitively coupled to the first end of the carbon nanotube;
   disposing a second metal electrode adjacent to and at a distance from the second end of the carbon nanotube, wherein the second metal electrode is capacitively coupled to the second end of the carbon nanotube;
   selectively applying a first bias to the first metal electrode to electrostatically dope the first end of the carbon nanotube; and
   selectively applying a second bias to the second metal electrode to electrostatically dope the second end of the carbon nanotube.

2. The method of claim 1, wherein the carbon nanotube comprises a carbon nanotube selected from the group consisting of a single-walled carbon nanotube and a multi-walled carbon nanotube.

3. The method of claim 1, wherein the carbon nanotube acts as a semiconductor material.

4. The method of claim 1, wherein the carbon nanotube has a center section disposed between the first end and the second end.

5. The method of claim 4, further comprising disposing at least one of a semiconductor material and a metal layer adjacent to at least a portion of the center section of the carbon nanotube, wherein the at least one of the semiconductor material and the metal layer is operable for modulating the doping of the center section of the carbon nanotube.

6. The method of claim 5, wherein the at least one of the semiconductor material and the metal layer comprises a material selected from the group consisting of Si, SiC, Al, Cr, Mo, Ti and Pt.

7. The method of claim 5, further comprising disposing a dielectric material directly adjacent to a surface of the at least one of the semiconductor material and the metal layer, wherein the dielectric material is disposed between the at least one of the semiconductor material and the metal layer and the carbon nanotube.

8. The method of claim 7, wherein the dielectric material is disposed about the first metal electrode and the second metal electrode.

9. The method of claim 7, wherein the dielectric material comprises a dielectric material selected from the group consisting of $SiO_2$, $Si_3N_4$, $Al_2O_3$ and $ZrO_2$.

10. The method of claim 1, wherein the first metal contact and the second metal contact each comprise a metal selected from the group consisting of Ti, Mo, Au and Cr.

11. The method of claim 1, wherein the first metal electrode and the second metal electrode each comprise a metal selected from the group consisting of Mo, Ti, Pt and Au.

12. The method of claim 1, wherein the first metal electrode is separated from the second metal electrode by a distance of between about 100 nm and about 10 microns.

13. The method of claim 1, wherein the first metal electrode is separated from the first end of the carbon nanotube and the second metal electrode is separated from the second end of the carbon nanotube by a distance of between about 2 nm and about 100 nm.

14. The method of claim 1, wherein selectively applying the first bias to the first metal electrode to electrostatically dope the first end of the carbon nanotube comprises making the first end of the carbon nanotube one of a p-type semiconductor (hole majority carrier) and an n-type semiconductor (electron majority carrier).

15. The method of claim 1, wherein selectively applying the second bias to the second metal electrode to electrostatically dope the second end of the carbon nanotube comprises making the second end of the carbon nanotube one of a p-type semiconductor (hole majority carrier) and an n-type semiconductor (electron majority carrier).

16. The method of claim 5, wherein modulating the doping of the center section of the carbon nanotube comprises making the center section of the carbon nanotube one of a p-type semiconductor (hole majority carrier), an I-type (intrinsic) semiconductor and an n-type semiconductor (electron majority carrier).

17. The method of claim 1, wherein disposing the first metal contact directly adjacent to the first end of the carbon nanotube and disposing the second metal contact directly adjacent to the second end of the carbon nanotube comprise providing the first metal contact and the second metal contact prior to providing the carbon nanotube.

18. The method of claim 1, wherein disposing the first metal contact directly adjacent to the first end of the carbon nanotube and disposing the second metal contact directly adjacent to the second end of the carbon nanotube comprise providing the first metal contact and the second metal contact subsequent to providing the carbon nanotube.

19. A structure for forming an electrostatically-doped carbon nanotube device, comprising:
   a carbon nanotube having a first end and a second end;
   a first metal contact disposed directly adjacent to the first end of the carbon nanotube, wherein the first metal contact is electrically coupled to the first end of the carbon nanotube;
   a second metal contact disposed directly adjacent to the second end of the carbon nanotube, wherein the second metal contact is electrically coupled to the second end of the carbon nanotube;
   a first metal electrode disposed adjacent to and at a distance from the first end of the carbon nanotube, wherein the first metal electrode is capacitively coupled to the first end of the carbon nanotube;
   a second metal electrode disposed adjacent to and at a distance from the second end of the carbon nanotube, wherein the second metal electrode is capacitively coupled to the second end of the carbon nanotube;

wherein the first metal electrode is operable for receiving a first bias to electrostatically dope the first end of the carbon nanotube; and wherein the second metal electrode is operable for receiving a second bias to electrostatically dope the second end of the carbon nanotube.

20. The structure of claim 19, wherein the carbon nanotube comprises a carbon nanotube selected from the group consisting of a single-walled carbon nanotube and a multi-walled carbon nanotube.

21. The structure of claim 19, wherein the carbon nanotube acts as a semiconductor material.

22. The structure of claim 19, wherein the carbon nanotube has a center section disposed between the first end and the second end.

23. The structure of claim 22, further comprising at least one of a semiconductor material and a metal layer disposed adjacent to at least a portion of the center section of the carbon nanotube, wherein the at least one of the semiconductor material and the metal layer is operable for modulating the doping of the center section of the carbon nanotube.

24. The structure of claim 23, wherein the at least one of the semiconductor material and the metal layer comprises a material selected from the group consisting of Si, SiC, Al, Cr, Mo, Ti and Pt.

25. The structure of claim 23, further comprising a dielectric material disposed directly adjacent to a surface of the at least one of the semiconductor material and the metal layer, wherein the dielectric material is disposed between the at least one of the semiconductor material and the metal layer and the carbon nanotube.

26. The structure of claim 25, wherein the dielectric material is disposed about the first metal electrode and the second metal electrode.

27. The structure of claim 25, wherein the dielectric material comprises a dielectric material selected from the group consisting of $SiO_2$, $Si_3N_4$, $Al_2O_3$ and $ZrO_2$.

28. The structure of claim 19, wherein the first metal contact and the second metal contact each comprise a metal selected from the group consisting of Ti, Mo, Au and Cr.

29. The structure of claim 19, wherein the first metal electrode and the second metal electrode each comprise a metal selected from the group consisting of Mo, Ti, Pt and Au.

30. The structure of claim 19, wherein the first metal electrode is separated from the second metal electrode by a distance of between about 100 nm and about 10 microns.

31. The structure of claim 19, wherein the first metal electrode is separated from the first end of the carbon nanotube and the second metal electrode is separated from the second end of the carbon nanotube by a distance of between about 2 nm and about 100 nm.

32. The structure of claim 19, wherein the first bias is operable for making the first end of the carbon nanotube one of a p-type semiconductor (hole majority carrier) and an n-type semiconductor (electron majority carrier).

33. The structure of claim 19, wherein the second bias is operable for making the second end of the carbon nanotube one of a p-type semiconductor (hole majority carrier) and an n-type semiconductor (electron majority carrier).

34. The structure of claim 23, wherein the semiconductor material is operable for making the center section of the carbon nanotube one of a p-type semiconductor (hole majority carrier), an I-type (intrinsic) semiconductor and an n-type semiconductor (electron majority carrier).

35. A method for forming an electrostatically-doped carbon nanotube device, comprising:
providing at least one of a semiconductor layer and a metal layer having a surface;
disposing a first insulating layer having a surface on the surface of the at least one of the semiconductor layer and the metal layer;
patterning and selectively disposing a metal electrode material having a surface on the surface of the first insulating layer;
disposing a second insulating layer having a surface on the surface of the first insulating layer and the surface of the metal electrode material;
patterning and selectively disposing a metal contact material having a surface on the surface of the second insulating layer;
patterning and selectively disposing a catalyst material on the surface of the metal contact material; and
growing a carbon nanotube from the catalyst material, wherein the carbon nanotube is aligned substantially parallel to the surface of the second insulating layer, and wherein a portion of the carbon nanotube is in contact with a portion of the metal contact material.

36. The method of claim 35, wherein patterning and selectively disposing the metal electrode material on the surface of the first insulating layer comprises selectively disposing a first area of metal electrode material and a second area of metal electrode material on the surface of the first insulating layer.

37. The method of claim 36, wherein patterning and selectively disposing the metal contact material on the surface of the second insulating layer comprises selectively disposing a first area of metal contact material and a second area of metal contact material on the surface of the second insulating layer, the first area of metal contact material disposed adjacent to the first area of metal electrode material and the second area of metal contact material disposed adjacent to the second area of metal electrode material.

38. The method of claim 37, wherein the carbon nanotube has a first end that is in contact with the first area of metal contact material and a second end that is in contact with the second area of metal contact material.

39. The method of claim 35, wherein the at least one of the semiconductor layer and the metal layer comprises a material selected from the group consisting of Si, SiC, Al, Cr, Mo, Ti and Pt.

40. The method of claim 35, wherein the at least one of the semiconductor layer and the metal layer has a thickness of between about 1 micron and about 550 microns.

41. The method of claim 35, wherein the first insulating layer and the second insulating layer each comprise a dielectric material selected from the group consisting of $SiO_2$, $Si_3N_4$, $Al_2O_3$ and $ZrO_2$.

42. The method of claim 35, wherein the first insulating layer has a thickness of between about 2 nm and about 100 nm.

43. The method of claim 35, wherein the second insulating layer has a thickness of between about 2 nm and about 100 nm.

44. The method of claim 35, wherein the metal electrode material comprises a metal selected from the group consisting of Mo, Ti, Pt and Au.

45. The method of claim 35, wherein the metal electrode material has a thickness of between about 10 nm and about 100 nm.

46. The method of claim 35, wherein the metal contact material comprises a metal selected from the group consisting of Ti, Mo, Au and Cr.

47. The method of claim 35, wherein the metal contact material has a thickness of between about 10 nm and about 100 nm.

48. The method of claim 37, wherein patterning and selectively disposing the catalyst material on the surface of the metal contact material comprises selectively disposing the catalyst material on one of the first area of metal contact material and the second area of metal contact material.

49. The method of claim 35, wherein the catalyst material comprises a catalyst material selected from the group consisting of a thin film and a nanoparticle.

50. The method of claim 35, wherein the catalyst material comprises a catalyst material selected from the group consisting of Ni, Fe, Co, Mo and $Al_2O_3$ in Fe nitrate.

51. The method of claim 35, wherein growing the carbon nanotube from the catalyst material comprises growing a carbon nanotube selected from the group consisting of a single-walled carbon nanotube and a multi-walled carbon nanotube.

52. The method of claim 35, wherein the carbon nanotube acts as a semiconductor material.

* * * * *